(12) United States Patent
Kim et al.

(10) Patent No.: US 11,758,671 B2
(45) Date of Patent: Sep. 12, 2023

(54) CURVATURE VARIABLE DISPLAY DEVICE

(71) Applicant: LG Display Co., Ltd., Seoul (KR)

(72) Inventors: JaeHo Kim, Gyeonggi-do (KR); SeokHyo Cho, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 98 days.

(21) Appl. No.: 17/492,268

(22) Filed: Oct. 1, 2021

(65) Prior Publication Data

US 2022/0201882 A1   Jun. 23, 2022

(30) Foreign Application Priority Data

Dec. 23, 2020   (KR) .......................... 10-2020-0182014

(51) Int. Cl.
*H05K 5/00* (2006.01)
*H05K 5/02* (2006.01)

(52) U.S. Cl.
CPC ......... *H05K 5/0226* (2013.01); *H05K 5/0017* (2013.01)

(58) Field of Classification Search
None
See application file for complete search history.

(56) References Cited

U.S. PATENT DOCUMENTS

| | | | |
|---|---|---|---|
| 9,307,658 B2 * | 4/2016 | Song | G06F 1/1601 |
| 9,348,450 B1 * | 5/2016 | Kim | H04M 1/0268 |
| 10,066,756 B2 * | 9/2018 | Sohn | F16K 31/002 |
| 2014/0118910 A1 * | 5/2014 | Sung | G02F 1/133305 |
| | | | 361/679.01 |
| 2014/0198465 A1 * | 7/2014 | Park | G09F 9/00 |
| | | | 361/749 |

* cited by examiner

*Primary Examiner* — Anthony Q Edwards
*Assistant Examiner* — Rashen E Morrison
(74) *Attorney, Agent, or Firm* — Birch, Stewart, Kolasch & Birch, LLP

(57) ABSTRACT

Provided is a curvature variable display device including a back plate provided on a rear surface of a panel assembly, a first side bracket and a second side bracket respectively coupled to two sides of a rear surface of the back plate, a bending plate rotatably coupled to the first side bracket and the second side bracket, a stand post coupled to the bending plate and the stand base, a wire moving member built into the stand post to move the wire by driving a motor and change the curvature of the panel assembly and the back plate.

20 Claims, 14 Drawing Sheets

CURVATURE VARIABLE DISPLAY DEVICE

CROSS REFERENCE TO RELATED APPLICATION

This application claims priority to Korean Patent Application No. 10-2020-0182014, filed on Dec. 23, 2020 in the Republic of Korea, the entire contents of which are hereby expressly incorporated by reference for all purposes as if fully set forth herein into the present application.

BACKGROUND

Field

Embodiments of the present disclosure relate to a curvature variable display device.

Description of Related Art

In general, a liquid crystal display (LCD) device, a plasma display device, a field emission display device, and a light emitting display device, and so on are under active study as flat display devices. Among them, the LCD device and the light emitting display device have attracted much interest due to their benefits of mass production, ease of driving means, and realization of high image quality.

Along with research efforts to overcome the technical shortcomings of these flat panel display devices, the necessity of research and development is particularly highlighted in terms of design of display products which are more appealing to users. Accordingly, the demand for a curved display device having a curvature in the display device is gradually increasing.

In addition, the curved display device has been developed in such a way that a predetermined curvature is formed on the display panel and the bottom cover, and a fixing device having the same curvature as that of the bottom cover is coupled to the rear surface of the bottom cover.

However, since such a curved display device or curved display device is manufactured with a constant curvature, the user cannot arbitrarily change the curvature, and only the previously manufactured curvature has to be used. Due to this, there is a limitation that it could not be used by changing it to a flat surface or a curved surface depending on the content to be viewed.

In particular, since the size of the display panel is gradually increasing in recent years, it can be rather difficult to develop various and innovative display devices capable of changing the curvature along with the slimming demanded by consumers.

Therefore, there is a need for research to address these limitations and provide a curvature variable display device that can appeal to users with more versatility of use.

BRIEF SUMMARY OF THE DISCLOSURE

Embodiments of the present disclosure provide a display device in which a user can arbitrarily change the curvature into a flat display mode and a curved display mode.

Further, embodiments of the present disclosure provide a display device capable of accommodating various needs of a user by making a panel assembly slim while allowing a user to easily change a curvature regardless of the size of a large area display device.

The objects of the embodiments of the present disclosure are not limited to what have been described above, and those skilled in the art will clearly understand other objects not mentioned herein from the following description.

According to an aspect, embodiments of the present disclosure provide a curvature variable display device including a back plate provided on a rear surface of a panel assembly, a first side bracket and a second side bracket respectively coupled to both sides of a rear surface of the back plate, a bending plate rotatably coupled to the first side bracket and the second side bracket, a stand post coupled to the bending plate and the stand base, a wire moving member built into the stand post to move the wire by driving a motor and change the curvature of the panel assembly and the back plate.

The embodiments of the present disclosure provide a display device in which a user can arbitrarily change the curvature into a flat display mode and a curved display mode.

The embodiments of the present disclosure provide a display device capable of accommodating various needs of a user by making a panel assembly slim while allowing a user to easily change a curvature regardless of the size of a large area display device.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
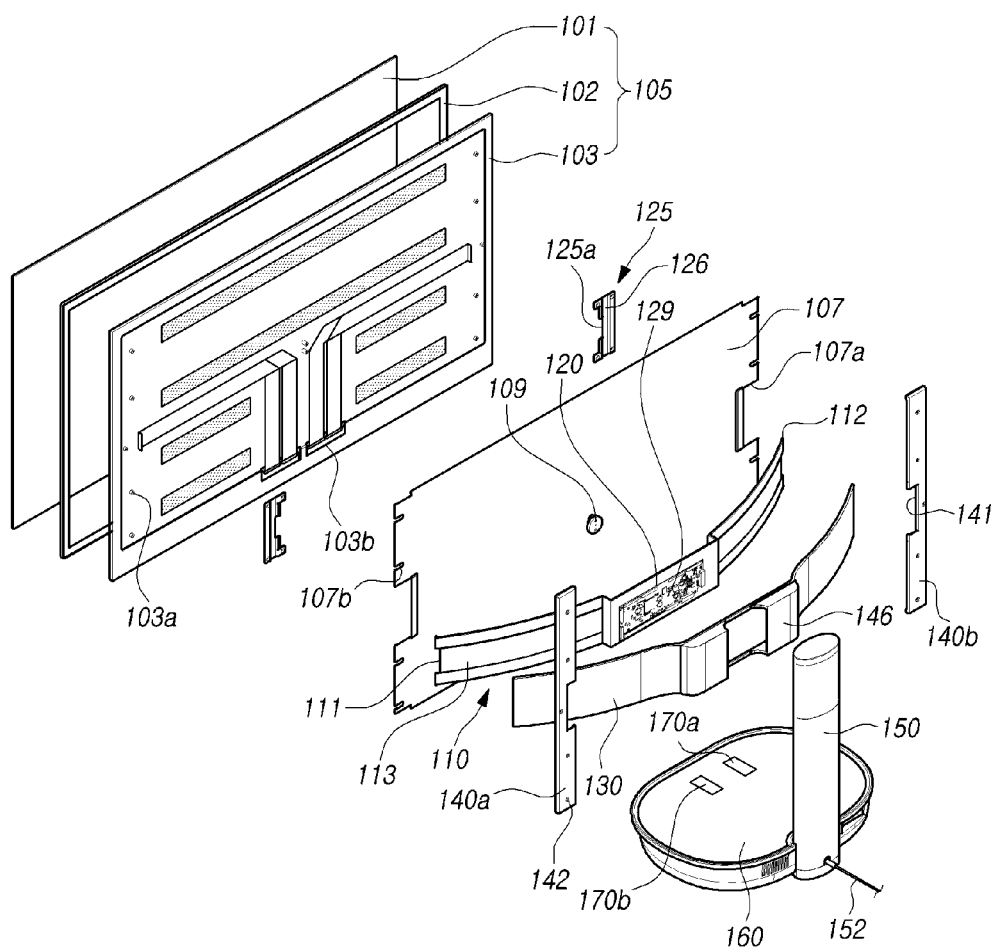
FIG. 1 is an exploded perspective view illustrating a curvature variable display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Figure 2:
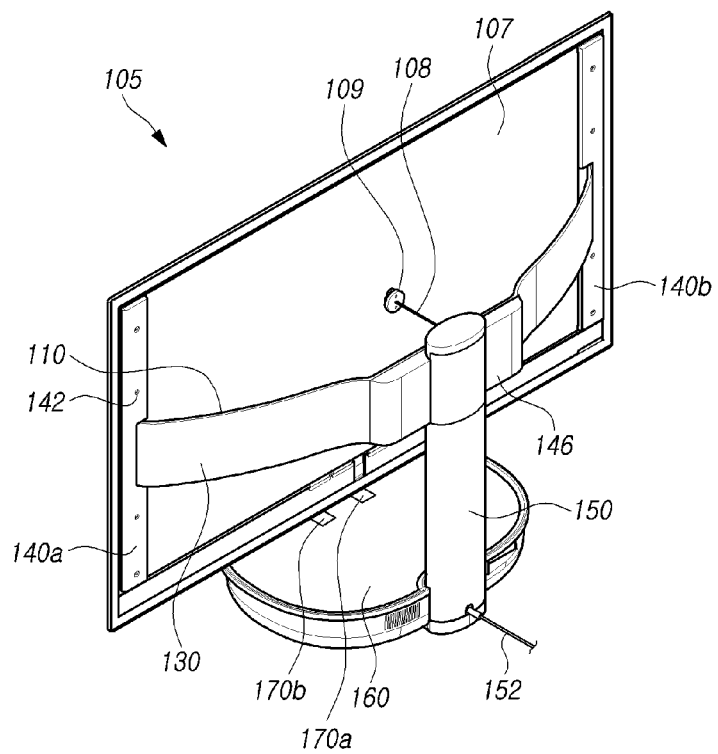
FIG. 2 is a perspective view illustrating the curvature variable display device according to embodiments of the present disclosure.
Figure 3:
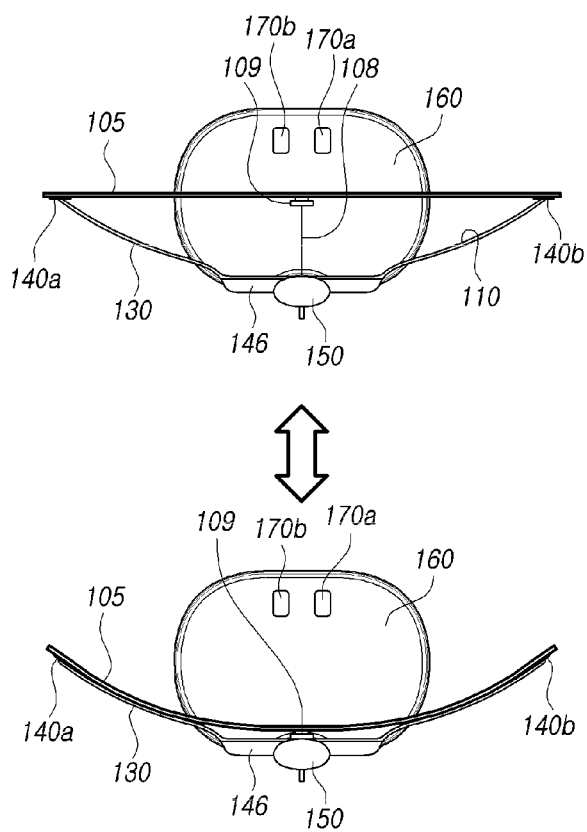
FIG. 3 is a plan view illustrating a state in which a curvature is changed in the curvature variable display device according to embodiments of the present disclosure.
Figure 12:
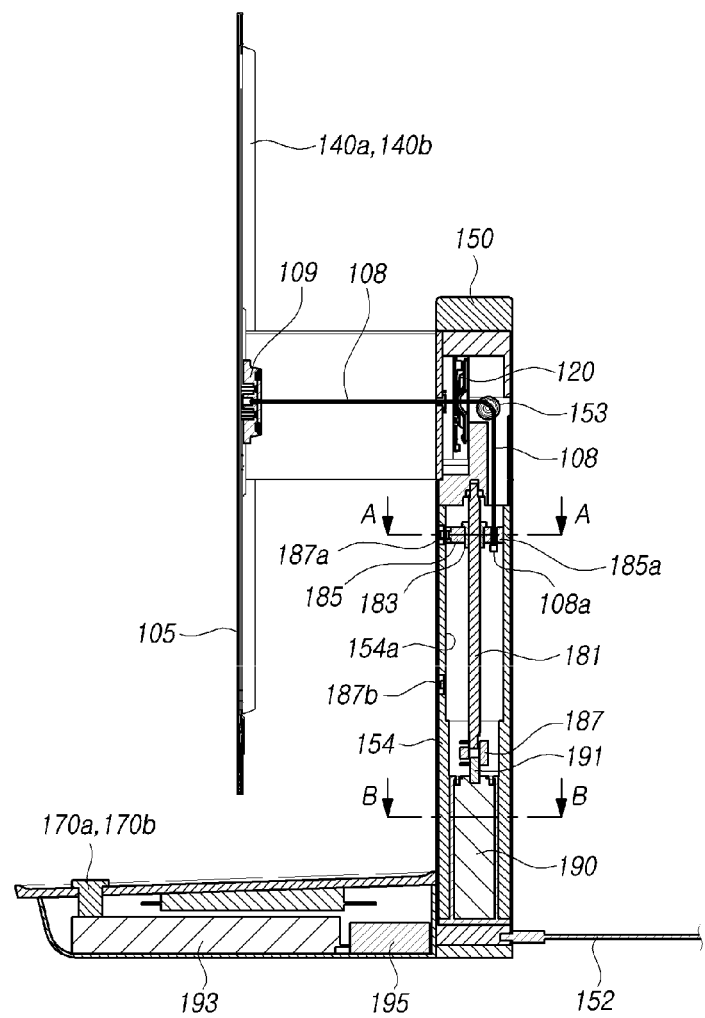
FIG. 12 is a sectional view illustrating the curvature variable display device according to embodiments of the present disclosure.
Figure 13:
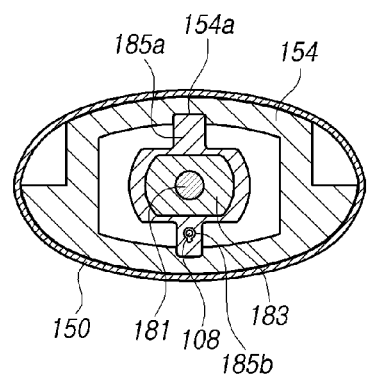
FIG. 13 is a sectional view showing a portion A-A of FIG. 12.
Figure 14:
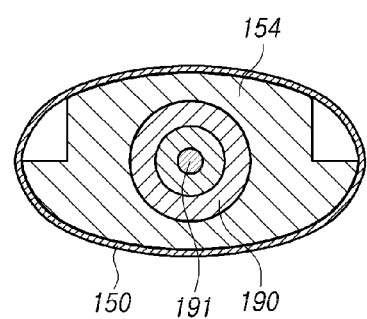
FIG. 14 is a sectional view showing a portion B-B of FIG. 12.

FIG. 1 is an exploded perspective view illustrating a curvature variable display device according to embodiments of the present disclosure. FIG. 2 is a perspective view illustrating the curvature variable display device according to embodiments of the present disclosure. FIG. 3 is a plan view illustrating a state in which a curvature is changed in the curvature variable display device according to embodiments of the present disclosure. FIGS. 4 to 11 are perspective views illustrating the curvature variable display device according to embodiments of the present disclosure. FIG. 12 is a sectional view illustrating the curvature variable display device according to embodiments of the present disclosure. FIG. 13 is a sectional view showing a portion A-A of FIG. 12. FIG. 14 is a sectional view showing a portion B-B of FIG. 12. All the components of each curvature variable display device according to all embodiments of the present disclosure are operatively coupled and configured.

As illustrated in FIGS. 1 to 14, the curvature variable display device according to embodiments of the present disclosure can include a panel assembly 105 including a display panel 101, a back plate 107 disposed on a rear surface of the panel assembly 105, a first side bracket 140a and a second side bracket 140b respectively coupled to both sides of a rear surface of the back plate 107, a bending plate 110 having one end rotatably coupled to the first side bracket 140a and the other end rotatably coupled to the second side bracket 140b and having a convex curvature toward a rear of the back plate 107, a stand post 150 having an upper end coupled to the center of the bending plate 110 and a lower end coupled to a stand base 160, a wire moving member 180 built into the stand post 150 to move a wire coupled to a rear surface of the back plate 107 by driving a motor 190 and to change curvatures of the panel assembly 105 and the back plate 107.

The curvature variable display device according to the embodiments of the present disclosure can implement both a flat display mode and a curved display mode according to a user's operation.

For example, the wire 108 coupled to the panel assembly 105 is coupled to the wire moving member 180 by the stand post 150, and both ends of the bending plate 110 in which the central portion is supported by the stand post 150 is rotatably coupled to the first side bracket 140a and the second side bracket 140b that support both sides of the panel assembly 105, so that when the user operates the motor 190 of the wire moving member 180 to move the wire 108, the curvature of the panel assembly 105 is changed.

In order to prevent the panel assembly 105 from being damaged or twisted when the curvature is changed, a back plate 107 is coupled to the rear surface of the panel assembly 105 to increase rigidity.

In the embodiments of the present disclosure, the display panel 101 can be applied irrespective of whether the display panel is a liquid crystal display panel or an organic light emitting display panel.

For example, when the display panel 101 is configured as an LCD panel, the panel assembly 105 can further include a backlight unit irradiating light onto the LCD panel, a lower polarization plate attached to a lower substrate, and an upper polarization plate attached to the front surface of an upper substrate. The specific configurations of the lower substrate and the upper substrate can be formed in various manners known to those skilled in the art according to, for example, twisted nematic (TN) mode, vertical alignment (VA) mode, in plane switching (IPS) mode, and fringe field switching (FFS) mode.

When the display panel 101 is configured as a light emitting display panel, the light emitting display panel can include a lower substrate in which a plurality of light emitting cells are formed in respective areas defined by gate lines, data lines, and power (VDD) lines, and an upper substrate face to face bonded to the lower substrate. This configuration is well known in the art to which the present disclosure is relevant, and thus related drawings and detailed description are not provided herein.

As such, the display panel 101 can be used irrespective of its type in embodiments of the present disclosure. Accordingly, the following description is given irrespective of the type of a display panel.

The bending plate 110 is formed in a curved surface having a convex curvature to the rear, and one end of the bending plate 110 is rotatably coupled to the first side bracket 140a and the other end is rotatably coupled to the second side bracket 140b.

Further, a wire fixing member 109 for fixing the end of the wire 108 is coupled to the rear center of the back plate 107, so that the curvature of the panel assembly 105 coupled to the back plate 107 is changed together when the wire 108 is pulled.

The panel assembly 105 includes a bottom cover 103 coupled to the rear surface of the display panel 101, a middle cabinet 102 coupled to edges of the display panel 101 and the bottom cover 103, and the like. The bottom cover 103 is provided with a pem nut 103a which is inserted into the fastening slits 107b formed at both ends of the back plate 107 and the insertion holes 142 formed in the first and second side brackets 140a and 140b, and is coupled with a fastening member.

In addition, magnets 104a and 104b are coupled between the rear surface of the bottom cover 103 and the front surface of the back plate 107, and the magnets 104a and 104b complement the rigidity of the bottom cover 103. Therefore, it is possible to minimize the pulling force of the wire 108 for changing the curvature by enabling a fine slip of the bottom cover 103 and the back plate 107 when the curvature is changed.

For example, in the case of a large-area display device, in the process of changing the curvature, a uniform frictional force is not generated in the entire area in which the bottom cover 103 and the back plate 107 contact each other, but a portion in which the frictional force is locally increased is generated. Accordingly, the pulling force of the wire 108 for changing the overall curvature is increased.

Therefore, coupling force is maintained by coupling the magnets 104a and 104b to a partial area between the bottom cover 103 and the back plate 107. And, it is possible to minimize the pulling force of the wire 108 for changing the overall curvature by accommodating the local slip between the bottom cover 103 and the back plate 107 to minimize the increase in the local friction force.

The magnets 104a and 104b can be provided at two or more places except for the area where the flexible circuit films 121a, 121b, and 123a, 123b are disposed. In the embodiments of the present disclosure, two are arranged on upper region of the flexible circuit film arranged on both sides, and two are respectively provided on one side and the other side of the vertically arranged flexible circuit film as an example.

Further, each of the first side bracket 140a and the second side bracket 140b is provided with a bracket cutout 141 through which the bending plate 110 passes, so that both ends of the bending plate 110 are rotatably supported when the curvature is changed. A hinge groove 143 into which the hinge portion 112 of the bending plate 110 is inserted and supported is provided in the upper and lower portions of the bracket cutout 141.

In addition, a plate cutout 107a is provided on both sides of the back plate 107 at positions corresponding to the bracket cutout 141. A hinge bracket 125 is coupled to the plate cutout 107a, and the hinge bracket 125 is provided with an end of the bending plate 110 and a receiving groove 126 in which the hinge portion 112 is accommodated.

Accordingly, the back plate 107 coupled to the hinge bracket 125 is supported by the hinge portion 112 of the bending plate 110 to be rotated when the curvature is changed.

Figure 4:
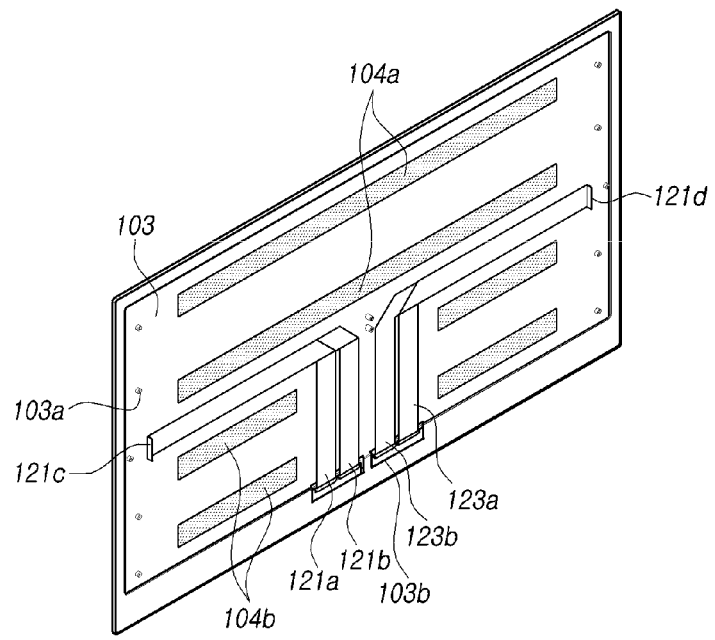
FIGS. 4 to 11 are perspective views illustrating the curvature variable display device according to embodiments of the present disclosure.
Figure 5:
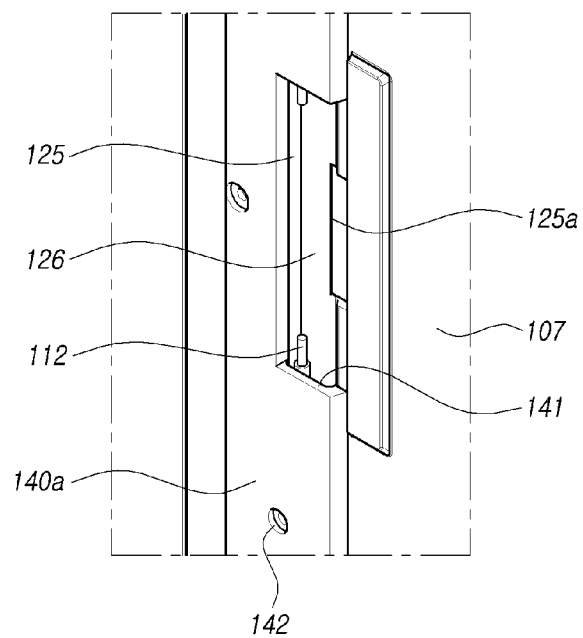
Figure 6:
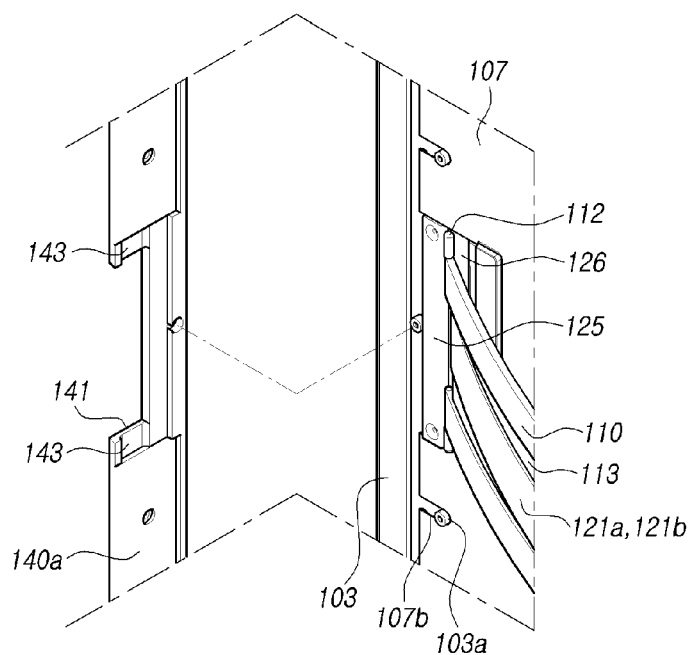
Figure 7:
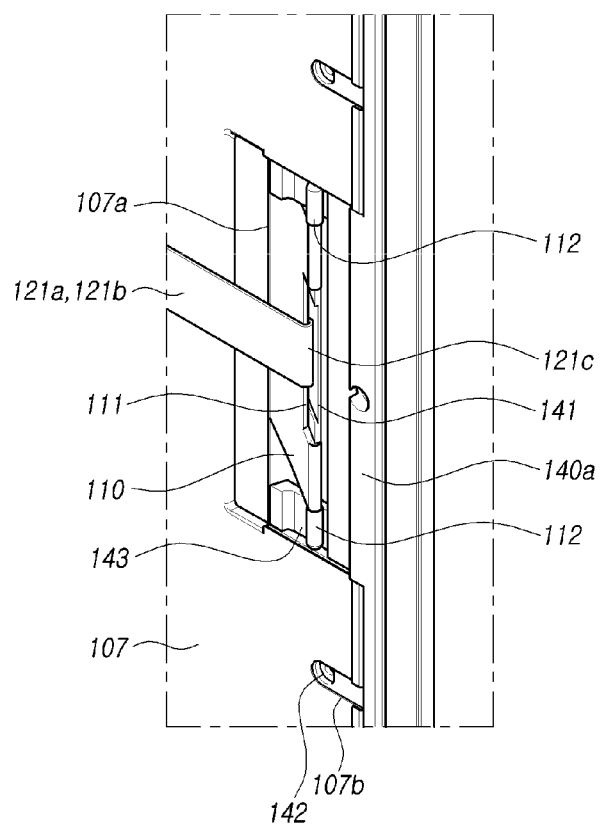
Figure 8:
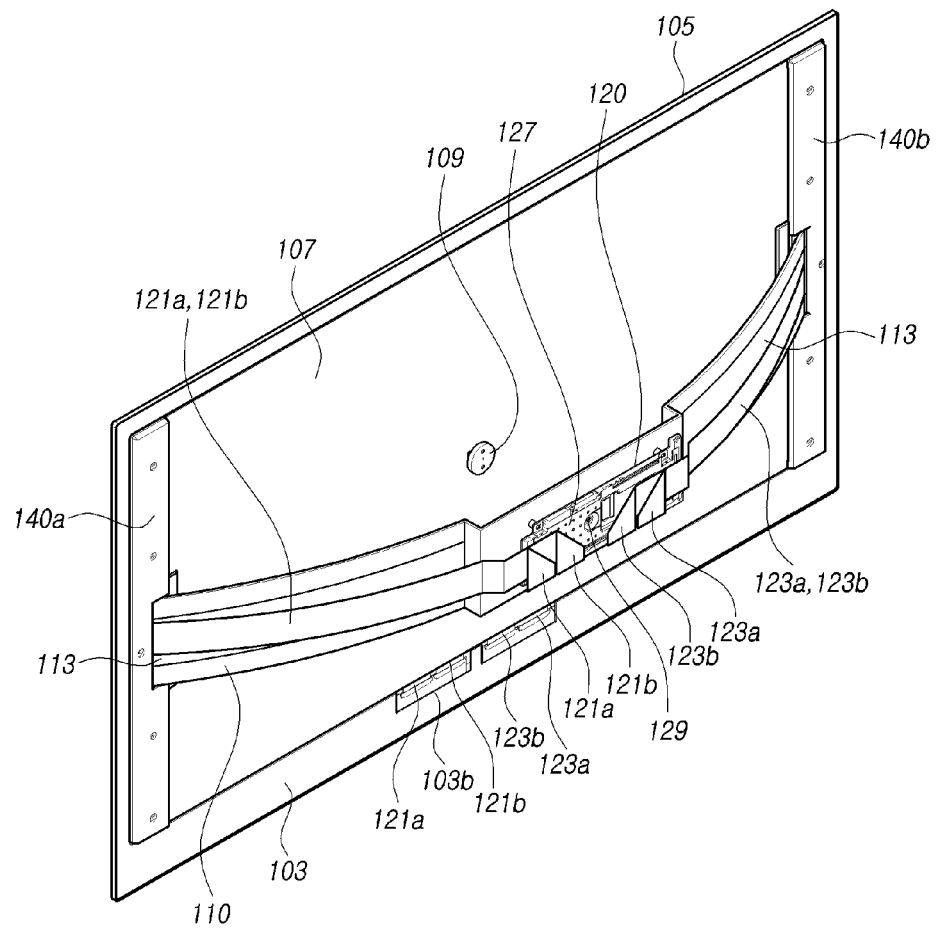
Figure 9:
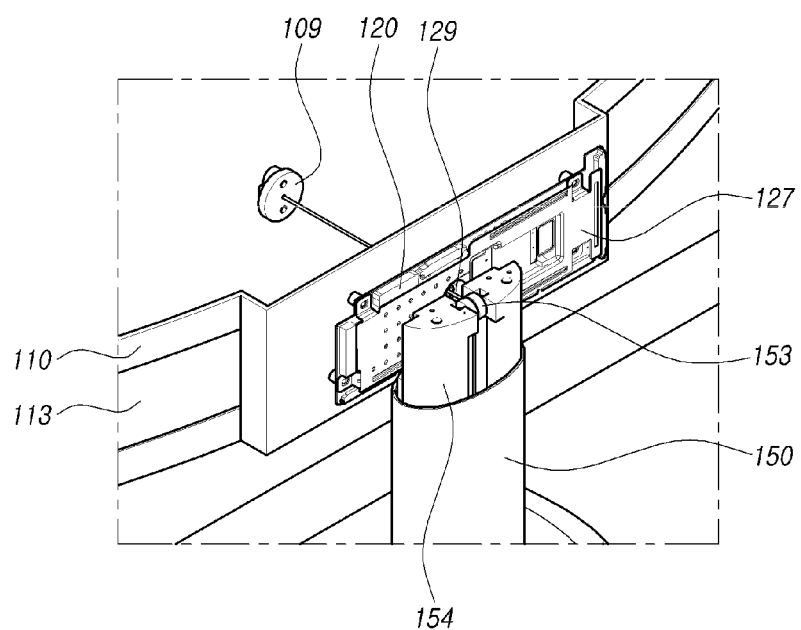
Figure 10:
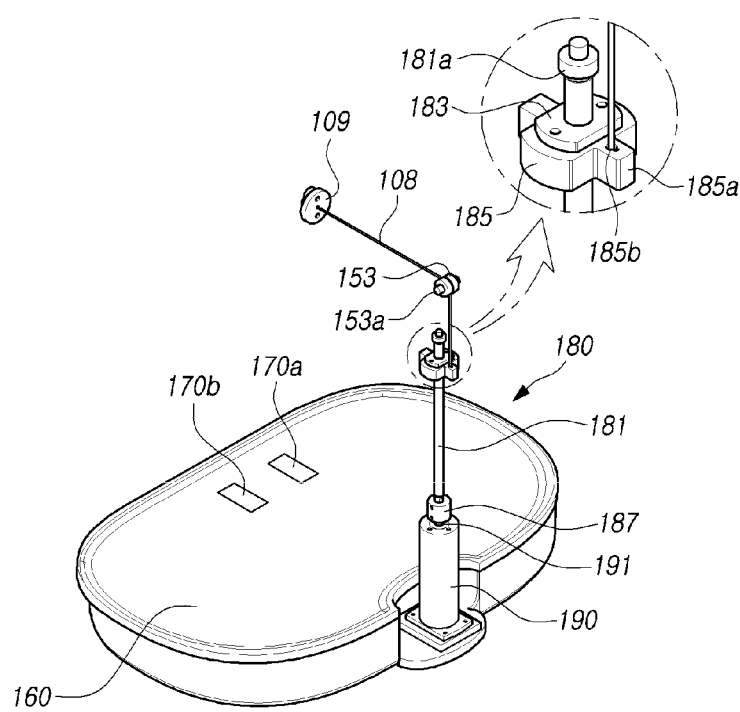
Figure 11:
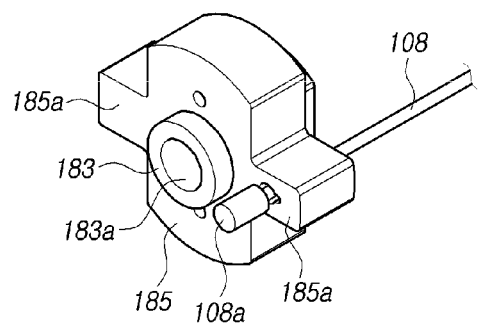

On the other hand, the end of the bending plate 110 is provided with a plate through hole 111, and the hinge bracket 125 is provided with a bracket through hole 125a at a position corresponding to the plate through hole 111, so that the outermost bending portions 121c, 121d on both sides of the flexible circuit films 121a, 121b, and 123a, 123b can pass through the plate through hole 111 and the bracket through hole 125a. In FIG. 4, for convenience of explanation, the flexible circuit films 121a, 121b, and 123a, 123b bent to the rear of the bending plate 110 is omitted and only the outermost bending portions 121c, 121d on both sides are shown.

For example, a film through hole 103b is provided in the bottom cover 103, so that the flexible circuit films 121a, 121b, and 123a, 123b connected to the source printed circuit board of the display panel 101 are disposed on the rear surface of the bottom cover 103. The flexible circuit films 121a, 121b, 123a, 123b passing through the film through hole 103b pass through the plate through hole 111 and the bracket through hole 125a and are disposed on the rear surface of the bending plate 110.

A control printed circuit board 120 connected the flexible circuit films 121a, 121b, 123a, 123b passing through the plate through hole 111 and the bracket through hole 125a is coupled to the rear surface of the central part of the bending plate 110, and a plate cover 130 is coupled to the rear of the bending plate 110.

The control printed circuit board 120 can be directly coupled to the rear surface of the bending plate 110 or coupled to a substrate bracket 127 coupled to the bending plate 110, in embodiments of the present disclosure, as an example, it is shown that the substrate bracket 127 is coupled to the rear surface of the central part of bending plate 110 and the control printed circuit board 120 is coupled to the substrate bracket 127.

The plate cover 130 is provided with a board receiving portion 146 in which the control printed circuit board 120 is accommodated, so that the plate cover 130 is coupled to surround the rear of the bending plate 110, the flexible circuit films 121a, 121b, 123a, 123b, the control printed circuit board 120 and the bending plate 110.

Further, the bending plate 110 is provided with stepped grooves 113 that accommodate flexible circuit films 121a, 121b, 123a, 123b so that it has its own space to accommodate flexible circuit films 121a, 121b, 123a, 123b in a state which the plate cover 130 is coupled to the bending plate 110.

Thus, it is possible to change the curvature of the panel assembly 105 and the back plate 107 in a slim appearance without external exposure of the flexible circuit films 121a, 121b, 123a, 123b and the control printed circuit board 120.

In addition, the bending plate 110 and the control printed circuit board 120 are provided with a wire through hole 129 through which the wire 108 coupled to the back plate 107 passes, so that the wire 108 connected to the center of the rear of the bending plate 110 can be disposed on the stand post 150 without interference.

One or more support rollers 153 supporting the wire 108 are rotatably coupled to the inside of the stand post 150 coupled to the center portion of the bending plate 110 and the plate cover 130, and an inner support portion 154 for rotatably supporting the rotation support portion 153a of the support roller 153 is provided inside the stand post 150.

The wire moving member 180 for moving the wire 108 coupled to the rear surface of the back plate 107 includes a screw shaft 181 connected to the shaft 191 of the motor 190 to rotate, a screw nut assembly 183, 185 coupled to the screw shaft 181 to move the wire 108 while moving up and down the stand post 150 when the screw shaft 181 rotates.

The screw nut assembly 183, 185 comprises a screw nut 183 through which the screw shaft 181 is coupled, a moving guide 185 coupled to one side of the wire 108 and coupled to an outside of the screw nut 183 and supported by an inner support portion 154 of the stand post 150 to slide.

The screw shaft 181 is rotated by being coupled to the shaft 191 of the motor 190 and the coupler 187, and a threaded portion is formed on the outer peripheral surface of the screw shaft 181, and a threaded portion engaged with the threaded portion of the screw shaft 181 is also formed on the inner peripheral surface 183a of the screw nut 183.

Therefore, when the screw shaft 181 is rotated by the motor 190, the moving guide 185 is supported by the inner support portion 154 of the stand post 150 and slides up and down, and the wire 108 coupled to the moving guide 185 also moves up and down to change the curvature of the back plate 107 and the panel assembly 105.

On the other hand, the stand base 160 is provided with a first switch unit 170a for operating the motor 190 to change to the flat panel display mode and the second switch unit 170b to change to the curved display mode.

The first switch unit 170a rotates the motor 190 in one direction so that the moving guide 185 moves upward, and the second switch unit 170b rotates the motor 190 in the other direction so that the moving guide 185 moves downward.

An inner upper end and lower end of the stand post 150 are provided with an upper position sensor 187a and a lower position sensor 187b, which sense a position of the moving guide 185 and transmit it to the mainboard 193 for controlling the motor 190.

The main board 193 stops the operation of the motor 190 when the moving guide 185 reaches the upper position sensor 187a during operation of the first switch unit 170a, and stops the operation of the motor 190 when the moving guide 185 reaches the lower position sensor 187b during operation of the second switch unit 170b.

For example, when the user operates the first switch unit 170a, the moving guide 185 is moved upward. The upper position sensor 187a is provided at a position where the panel assembly 105 and the back plate 107 become flat. In this case, when the moving guide 185 reaches the upper position sensor 187a, a signal is transmitted to the main board 193, and the main board 193 stops the operation of the motor 190 when it receives a signal from the upper position sensor 187a in a state in which the first switch unit 170a is operated.

Further, when the user operates the second switch unit 170b, the moving guide 185 is moved downward. The lower position sensor 187b is provided at a position where the curvature of the panel assembly 105 and the back plate 107 become maximum. In this case, when the moving guide 185 reaches the lower position sensor 187b, a signal is transmitted to the main board 193, and the main board 193 stops the operation of the motor 190 when it receives a signal from the lower position sensor 187b in a state in which the second switch unit 170b is operated.

Therefore, when the change to the flat display mode and the curved display mode desired by the user is completed, unnecessary operation of the motor 190 is stopped and the user can recognize that the change has been completed.

The motor 190 is fixed to the inner support portion 154 of the stand post 150 and the upper end of the screw shaft 181 is rotatably coupled to the inner support portion 154 of the stand post 150 via a bearing 181a. Thus, when the motor 190 is operated, the screw shaft 181 is accurately supported while being coaxial with the shaft 191 of the motor 190.

The moving guide 185 is provided with a guide protrusion 185a protruding to the outside, and the inner support portion 154 of the stand post 150 is provided with a guide groove 154a into which the guide protrusion 185a of the moving guide 185 is inserted and supported.

The guide groove 154a formed in the inner support portion 154 of the stand post 150 is configured to support both sides of the guide protrusion 185a, so that the wire 108 can be moved without being biased to either side when the moving guide 185 moves up and down.

The guide protrusion 185a can be provided on opposite sides of the moving guide 185, and the guide protrusion 185a is provided with a through hole 185b through which the wire 108 passes. The end of the wire 108 passing through the through hole 185b of the guide protrusion 185a is provided with a fixed end 108a supported on the rear surface of the guide protrusion 185a, so that the wire 108 is prevented from being separated when the moving guide 185 is moved.

Meanwhile, inside the stand base 160, the main board 193 and the power board 195 connected to the control printed circuit board 120 are installed to be connected to the power cable 152.

As described above, according to embodiments of the present disclosure, there can be provided a curvature variable display device in which a user can arbitrarily change the curvature into a flat display mode and a curved display mode.

Further, according to embodiments of the present disclosure, there can be provided a curvature variable display device capable of accommodating various needs of a user by making a panel assembly slim while allowing a user to easily change a curvature regardless of the size of a large area display device.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only.

For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A curvature variable display device, comprising:
a panel assembly including a display panel;
a back plate provided on a rear surface of the panel assembly;
a first side bracket and a second side bracket respectively coupled to two sides of a rear surface of the back plate;
a bending plate having one end rotationally coupled to the first side bracket and another end rotationally coupled to the second side bracket, and having a convex curvature toward a rear of the back plate;
a stand post having an upper end coupled to a center area of the bending plate and a lower end coupled to a stand base; and
a wire moving member built into the stand post to move a wire coupled to the rear surface of the back plate by driving a motor and to change curvatures of the panel assembly and the back plate,
wherein a bracket cutout through which the bending plate passes is provided in each of the first side bracket and the second side bracket,
wherein hinge grooves in which a hinge portion of the bending plate is inserted and supported are provided at upper and lower portions of the bracket cutout, wherein a plate cutout is provided on both sides of the back plate at positions corresponding to the bracket cutout, and wherein a hinge bracket having an end of the bending plate and a receiving groove for accommodating the hinge portion of the bending plate is coupled to the plate cutout.

2. The curvature variable display device according to claim 1, wherein a wire fixing member for fixing an end of the wire is coupled to a center area of the back plate.

3. The curvature variable display device according to claim 1, wherein the panel assembly comprises a bottom cover coupled to the rear surface of the display panel, and a magnet is coupled between the bottom cover and the back plate.

4. The curvature variable display device according to claim 1, wherein a plate through hole is provided at an end of the bending plate, a bracket through hole is provided in a position corresponding to the plate through hole in the hinge bracket, and a flexible circuit film connected to a source printed circuit board of the display panel is disposed on the rear surface of the bending plate through the plate through hole and the bracket through hole.

5. The curvature variable display device according to claim 4, wherein a control printed circuit board connected to the flexible circuit film is coupled to a rear surface of a central portion of the bending plate.

6. The curvature variable display device according to claim 5, wherein a wire through hole through which the wire passes is provided in the bending plate and the control printed circuit board.

7. The curvature variable display device according to claim 5, wherein one or more support rollers configured to support the wire are rotatably coupled to inside of the stand post.

8. The curvature variable display device according to claim 1, wherein the wire moving member comprises:

a screw shaft connected to a shaft of the motor to rotate; and a screw nut assembly coupled to the screw shaft to move the wire while moving up and down the stand post when the screw shaft rotates.

9. The curvature variable display device according to claim 8, wherein the screw nut assembly comprises:

a screw nut through which the screw shaft is coupled; and a moving guide coupled to one side of the wire and coupled to outside of the screw nut and supported by an inner support portion of the stand post to slide.

10. The curvature variable display device according to claim 9, wherein a first switch unit for moving the moving guide upward by rotating the motor in one direction and a second switch unit for moving the moving guide downward by rotating the motor in another direction are provided on the stand base.

11. The curvature variable display device according to claim 10, wherein an upper position sensor and a lower position sensor are provided at an inner upper end and a lower end of the stand post to sense the position of the moving guide and transmit information on the sensed position to a main board for controlling the motor.

12. The curvature variable display device according to claim 11, wherein the main board stops an operation of the motor when the moving guide reaches the upper position sensor during an operation of the first switch unit, and the main board stops an operation of the motor when the moving guide reaches the lower position sensor during an operation of the second switch unit.

13. The curvature variable display device according to claim 9, wherein the motor is fixed to the inner support portion of the stand post, and an upper end of the screw shaft is rotatably coupled to the inner support portion of the stand post by at least one bearing.

14. The curvature variable display device according to claim 9, wherein the moving guide is provided with a guide protrusion protruding to the outside, and the inner support portion of the stand post is provided with a guide groove in which the guide protrusion is inserted.

15. The curvature variable display device according to claim 14, wherein the guide protrusion of the moving guide is provided on opposite sides of the moving guide, and the guide protrusion is provided with a through hole through which a wire passes.

16. The curvature variable display device according to claim 15, wherein a fixed end supported on a rear surface of the guide protrusion is provided at an end of the wire passing through the through hole.

17. A curvature variable display device, comprising:

a panel assembly including a display panel;

a back plate provided on a rear surface of the panel assembly;

a first side bracket and a second side bracket respectively coupled to two sides of a rear surface of the back plate;

a bending plate having one end rotationally coupled to the first side bracket and another end rotationally coupled to the second side bracket, and having a convex curvature toward a rear of the back plate;

a stand post having an upper end coupled to a center area of the bending plate and a lower end coupled to a stand base; and a wire moving member built into the stand post to move a wire coupled to the rear surface of the back plate by driving a motor and to change curvatures of the panel assembly and the back plate, wherein the wire moving member comprises:

a screw shaft connected to a shaft of the motor to rotate; and a screw nut assembly coupled to the screw shaft to move the wire while moving up and down the stand post when the screw shaft rotates, and wherein the screw nut assembly comprises:

a screw nut through which the screw shaft is coupled; and a moving guide coupled to one side of the wire and coupled to outside of the screw nut and supported by an inner support portion of the stand post to slide.

18. The curvature variable display device according to claim 17, wherein a wire fixing member for fixing an end of the wire is coupled to a center area of the back plate.

19. The curvature variable display device according to claim 17, wherein the panel assembly comprises a bottom cover coupled to the rear surface of the display panel, and a magnet is coupled between the bottom cover and the back plate.

20. The curvature variable display device according to claim 17, wherein a bracket cutout through which the bending plate passes is provided in each of the first side bracket and the second side bracket, and hinge grooves in which a hinge portion of the bending plate is inserted and supported are provided at upper and lower portions of the bracket cutout.

* * * * *